(12) United States Patent
Kim et al.

(10) Patent No.: US 6,914,462 B2
(45) Date of Patent: Jul. 5, 2005

(54) POWER-ON RESET CIRCUIT AND METHOD

(75) Inventors: Young-Seung Kim, Seoul (KR); Young-Dae Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/440,685

(22) Filed: May 19, 2003

(65) Prior Publication Data
US 2004/0012419 A1 Jan. 22, 2004

(30) Foreign Application Priority Data
Jul. 18, 2002 (KR) ................................. 10-2002-0041949

(51) Int. Cl.[7] ................................................ H03L 7/00
(52) U.S. Cl. ..................................................... 327/143
(58) Field of Search ................................. 327/143, 198

(56) References Cited

U.S. PATENT DOCUMENTS 6,078,201 A 6/2000 Crotty ......................... 327/143
2001/0054921 A1 * 12/2001 Akiyoshi ..................... 327/143
2002/0140468 A1 * 10/2002 Kato et al. ................... 327/143
2002/0171461 A1 * 11/2002 Yamazaki et al. ........... 327/143

FOREIGN PATENT DOCUMENTS

JP 2001-111466 12/2002

OTHER PUBLICATIONS

English Abstract Only.

* cited by examiner

Primary Examiner—Quan Tra
(74) Attorney, Agent, or Firm—F. Chau & Associates, LLC

(57) ABSTRACT

There is provided a power-on reset circuit and method for a semiconductor integrated circuit device using a plurality of power sources, in which a power-on reset operation is stable and reliable, where the power-on reset circuit includes voltage detection circuits for generating at least two voltage detection signals with respect to the power sources, the power-on reset circuit generates a plurality of power-on reset signals using combination logic circuits for performing logic operations of the voltage detection signals, and internal latches and flip-flops are stably reset in response to the plurality of power-on reset signals.

18 Claims, 7 Drawing Sheets

POWER-ON RESET CIRCUIT AND METHOD

BACKGROUND OF THE INVENTION

1. Field of the Invention

The present invention relates to power-on reset circuits, and more particularly, to a power-on reset circuit and power-on reset method of a semiconductor integrated circuit using a plurality of power sources.

2. Discussion of the Related Art

Semiconductor integrated circuit devices generally include a power-on reset circuit to prevent abnormal operations when a power source is applied thereto. Generally, once the power source is applied to the semiconductor integrated circuit device and reaches a predetermined voltage, the power-on reset circuit provides a reset signal for initializing components of a semiconductor memory device, such as flip-flops, latches, counters, registers, and the like. A typical voltage detection circuit outputs an activated power-on reset signal if the power source voltage reaches a predetermined voltage when the power is on. Internal components of the semiconductor integrated circuit are reset to an initial state in response to the activated power-on reset signal. Then, if the power source voltage reaches a normal operating voltage, the power-on reset signal is deactivated. As demands for high-speed integrated circuits are increasing, integrated circuits utilizing a plurality of power sources are more widely used. For example, separate power sources are used for input/output pins, input/output buffers, memory cells, and the like.

FIG. 1 is a schematic diagram showing a problem caused in a conventional power-on reset circuit of a semiconductor memory device 100 using a plurality of power sources. If a voltage level of a power source VDD1 supplied to a typical memory device reaches a predetermined voltage, a power-on reset circuit 10 detects the voltage level and generates a pulse with a constant width, i.e., a power-on reset signal POR. The power-on reset signal POR sets all the nodes needing to be initialized within the memory device to logic high states. Here, the nodes include a node N1 connected with a first latch 30 and a node N2 connected with a second latch 50.

Unfortunately, although the power source VDD1 reaches the predetermined voltage level to generate the power-on reset signal and then reaches a stable voltage level, a power source VDD2 might not reach a stable voltage level prior to the POR pulse. Therefore, in a PMOS transistor (PM1) 70 having a drain electrode connected to the node N1, a source electrode connected to the power source VDD2 and a gate electrode receiving the power-on reset signal, the source electrode of the PMOS transistor 70 does not reach a stable voltage level and thus the PMOS transistor 70 does not activate. As a result, the initialization of the node N1 fails.

In addition, after the power-on reset signal POR generated in response to the power source VDD1 by the power-on reset circuit 10 is delayed for a predetermined time, a noise may occur in the power source VDD3 that reaches a stable state when the power-on reset signal POR reaches a gate electrode of a PMOS transistor (PM2) 90 connected between a power source VDD3 and the node N2. In other words, in a case where a noise occurs after the power source VDD1 reaches a stable voltage level or in a case where a noise occurs at the power source VDD3 itself, since the power source VDD3 is unstable at a point when the power-on reset signal POR reaches the gate electrode of the PMOS transistor 90, the PMOS transistor 90 is not activated. As a result, the initialization of the node N2 fails.

Accordingly, it is desirable to provide a stable power-on reset circuit and method for a semiconductor memory device using a plurality of power sources.

SUMMARY OF THE INVENTION

The present invention is directed towards a power-on reset circuit and power-on reset method that substantially obviate one or more of the problems, limitations and disadvantages of the related art.

An advantage of the present invention is to provide a power-on reset method of a semiconductor integrated circuit using a plurality of power sources.

Another advantage of the present invention is to provide a stable power-on reset circuit of a semiconductor integrated circuit using a plurality of power sources.

These and other features and advantages of the present invention may be understood from the description that follows, and will become apparent to those having ordinary skill in the pertinent art upon examination of the following, or may be learned from practice of the invention. The features and other advantages of the invention may be realized and attained by the structure particularly pointed out in the written description and claims hereof, as well as in the appended drawings.

To achieve these features and other advantages and in accordance with a purpose of the invention, as embodied and broadly described herein, a power-on reset method of an integrated circuit device comprises the steps of: providing a power-on reset pulse whenever a plurality of respective power source voltages supplied from individual power sources reach a plurality of predetermined detection voltages, respectively; and repeatedly initializing internal circuits of the integrated circuit device in response to the power-on reset pulse.

The step of providing the power-on reset pulse includes the steps of (a) providing a plurality of voltage detection circuits receiving the power source voltages, the respective voltage detection circuits corresponding to the respective power sources, (b) generating a plurality of voltage detection signals corresponding to a plurality of predetermined detection voltages by the respective voltage detection circuits, (c) providing a plurality of pulse generation circuits corresponding to the plurality of predetermined detection voltages, (d) generating a plurality of power-on reset pulses corresponding to the plurality of predetermined detection voltages by the respective pulse generation circuits, (e) providing a pulse output means receiving the power-on reset pulses generated from the pulse generation circuits, and (f) providing the power-on reset pulses by the pulse output means. Logic states of the respective voltage detection signals change whenever the power source voltages reach corresponding detection voltages. The pulse output means is an OR gate.

To achieve the above feature, there is provided a power-on reset method for resetting internal circuits of an integrated circuit device using a plurality of power source voltages, which comprises the steps of: generating voltage detection signals in response to the plurality of power source voltages when the power source voltages go beyond a plurality of detection voltages; generating power-on reset pulses using the voltage detection signals; and initializing the internal circuits in response to the power-on reset pulses.

The internal circuits are initialized whenever the power-on reset pulses are generated, and finally initialized by the last power-on reset pulse.

In accordance with an embodiment of the present invention, the plurality of detection voltages are a first detection voltage and a second detection voltage, and the voltage detection signals are first voltage detection signals and second voltage detection signals of which logic states changes when the power source voltages go beyond the first detection voltage and the second detection voltage.

The step of generating the power-on reset pulses includes the steps of: generating first and second detection pulses from the first and second voltage detection signals generated with respect to the respective power source voltages; and outputting the first and second detection pulses via an OR gate.

To achieve another feature, there is provided a power-on reset circuit which comprises: M voltage detection circuits for generating first detection signals and second detection signals in response to M power source voltages when the power source voltages reach first and second detection voltages, M being an integer equal to or greater than two; first and second pulse generation circuits for receiving the M first detection signals and the M second detection signals from the M voltage detection circuits and generating maximum M first power-on reset pulses and maximum M second power-on reset pulses, respectively; and a pulse output means for receiving the first and second power-on reset pulses and outputting final power-on reset pulses, the maximum number of the final power-on reset pulses being 2×M. Preferably, the pulse output means is an OR gate.

In an embodiment of the present invention, each of the M voltage detection circuits includes: a first voltage detection circuit for generating the first detection signals of which logic states changes when the corresponding power source voltages go beyond the first detection voltage; and a second voltage detection circuit for generating the second detection signals of which logic states changes when the corresponding power source voltages go beyond the second detection voltage.

In an embodiment of the present invention, each of the first and second pulse generation circuits includes: a first AND gate receiving the detection signals; an inversion delay unit connected to an output terminal of the first AND gate; and a second AND gate connected to the output terminal of the first AND gate and the an output terminal of the inversion delay unit.

In an embodiment of the present invention, each of the first and second pulse generation circuits includes: M pulse generators for generating pulses with respect to the M detection signals; and an OR gate connected to output terminals of the M pulse generator, each of the M pulse generator including: an inversion delay unit receiving the corresponding detection signal; and an AND gate receiving an output of the inversion delay unit and the corresponding detection signal.

In an embodiment of the present invention, the first pulse generation circuit includes: a first AND gate receiving the detection signals; an inversion delay unit connected to an output terminal of the first AND gate; and a second AND gate connected to the output terminal of the first AND gate and an output terminal of the inversion delay unit, wherein the second pulse generation circuit includes: M pulse generation circuits for generating pulses with respect to the M second detection signals; and an OR gate connected to output terminals of the M pulse generation circuits, each of the M pulse generation circuits including: an inversion delay unit receiving the corresponding second detection signal; and an AND gate receiving an output of the inversion delay unit and the corresponding detection signal.

It is to be understood that both the foregoing general description and the following detailed description of the present invention are exemplary and explanatory and are intended to provide further explanation of the invention as claimed.

DETAILED DESCRIPTION OF PREFERRED EMBODIMENTS

Preferred embodiments of the present invention will now be described with respect to the examples illustrated in the accompanying drawings. However, the present invention is not limited to the exemplary embodiments illustrated herein, and such embodiments are introduced to facilitate understanding of the scope and spirit of the present invention.

Figure 1:
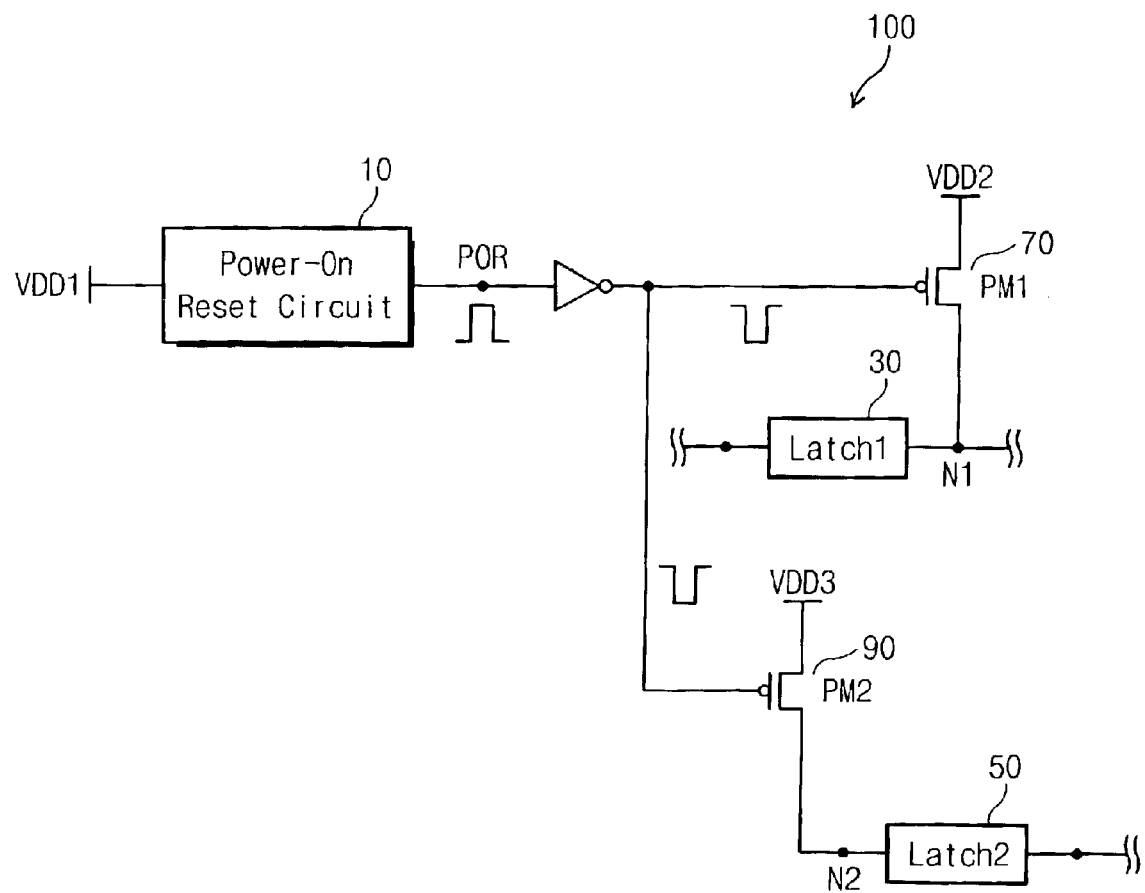
FIG. 1 is a schematic diagram explaining a problem caused in a conventional power-on reset method.
Figure 2:
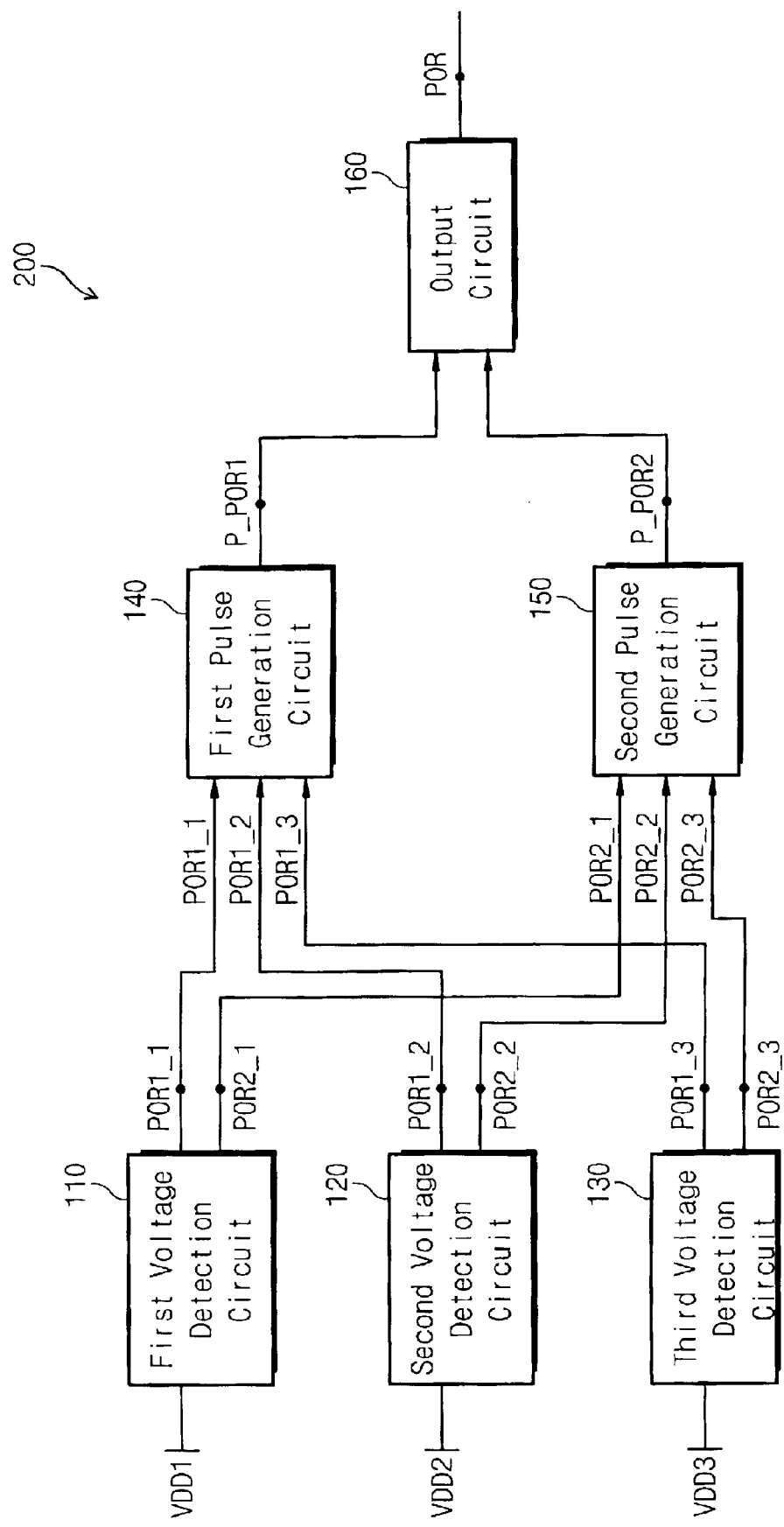
FIG. 2 is a block diagram explaining a power-on reset method in accordance with an embodiment of the present invention.

As shown in FIG. 2, a block diagram explaining a power-on reset method in accordance with the present invention is indicated generally by the reference numeral 200. In FIG. 2, power sources VDD1, VDD2 and VDD3 can be external power sources supplied from an exterior of a semiconductor integrated circuit, for example. In addition, some power sources (e.g., the power source VDD3) can be internal power sources generated from external power sources (e.g., the power source VDD2). To facilitate understanding of the present invention, only three power sources are illustrated in the drawings. However, it shall be understood that two or more power sources can be used within the scope and spirit of the present invention.

In the diagram 200, three voltage detection circuits 110, 120 and 130 are used corresponding to the three power sources VDD1, VDD2 and VDD3, respectively. The voltage detection circuits 110, 120 and 130 generate three voltage detection signals POR1_1/POR2_1, POR1_2/POR2_2 and POR1_3/POR2_3, respectively. In other words, the first voltage detection circuit 110 generates a primary voltage detection signal POR1_1 if the power source VDD1 reaches a primary detection voltage, and generates a secondary voltage detection signal POR2_1 if the power source VDD1 reaches a secondary detection voltage. In the same manner, the second voltage detection circuit 120 generates a primary voltage detection signal POR1_2 if the power source VDD2 reaches a primary detection voltage, and generates a secondary voltage detection signal POR2_2 if the power source VDD2 reaches a secondary detection voltage. Likewise, the third voltage detection circuit 130 generates a primary voltage detection signal POR1_3 if the power source VDD3 reaches a primary detection voltage, and generates a secondary voltage detection signal POR2_3 if the power source VDD3 reaches a secondary detection voltage.

According to another embodiment of the present invention, two or more voltage detection signals can be generated. Further, the primary and secondary voltage detection signals can be various types. For example, the detection signals can be signals whose logic states change when corresponding power source goes beyond the detection voltage (e.g., signals whose logic states change from a logic high state to a logic low state, or from a logic low state to a logic high state) or pulse signals having constant width and height.

The primary voltage detection signals POR1_1, POR1_2 and POR1_3 respectively generated from the voltage detection circuits 110, 120 and 130 are inputted into a first pulse generation circuit 140. In the same manner, the secondary voltage detection signals POR2_1, POR2_2 and POR2_3 respectively generated from the voltage detection circuits 110, 120 and 130 are inputted into a second pulse generation circuit 150. The first and second pulse generation circuits 140 and 150 respectively receiving the primary and secondary voltage detection signals generate a first power-on reset pulse P_POR1 and a second power-on reset pulse P_POR2, respectively. At this time, the number of the first and second power-on reset pulses P_POR1 and P_POR2 is at least one, and equal to the same number as the inputted signals, up to the maximum. The first power-on reset pulse P_POR1 has a height corresponding to the magnitude of a primary voltage detection signal, and the second power-on reset pulses P_POR2 has a height corresponding to magnitude of a secondary voltage detection signal. The power-on reset pulses P_POR1 and P_POR2 outputted from the first and second pulse generation circuits 140 and 150 are inputted into a pulse output unit 160, and the pulse output unit 160 generates a plurality of power-on reset pulses POR.

Accordingly, in a power-on reset method of the present invention, a plurality of power-on reset pulses are generated such that the nodes that need to be initialized can be initialized whenever the power-on reset pulses are generated. The nodes can be initialized by a generated POR pulse. Thus, if a voltage level of a power source rises to reach a secondary detection voltage, a power-on reset pulse is generated and the initialization is completed.

Figure 3:
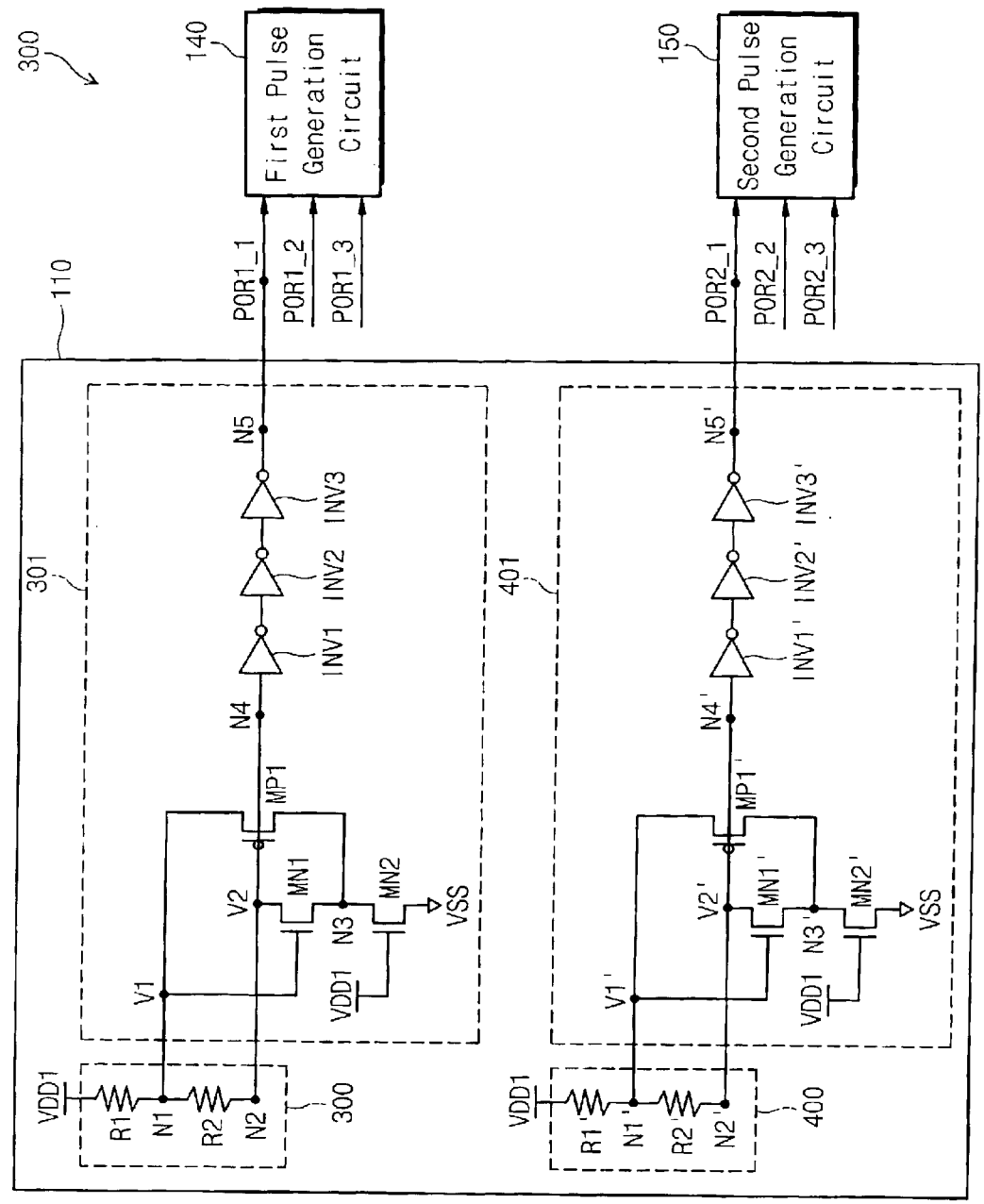
FIG. 3 is a circuit diagram of the voltage detection circuit of FIG. 2 in accordance with an embodiment of the present invention.

Turning to FIG. 3, a voltage detection circuit in accordance with the present invention is indicated generally by the reference numeral 300. Here, only the first voltage detection circuit 110 corresponding to the power source VDD1 is shown for ease of explanation. The remaining voltage detection circuits corresponding to the remaining power sources have the same configuration as the first voltage detection circuit 110, but are not shown in order to avoid repetition of explanation.

Figure 4:
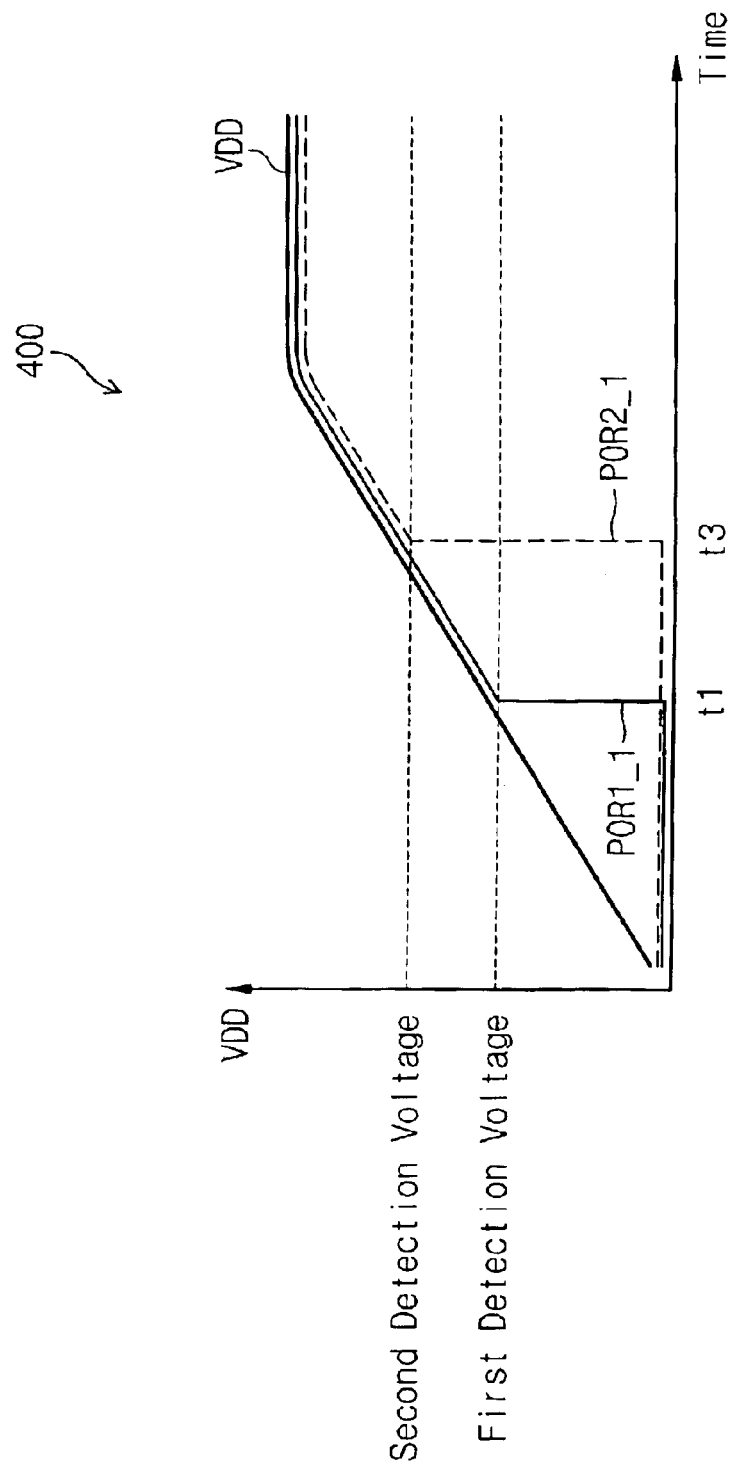
FIG. 4 is a graphical diagram of an output signal waveform of the voltage detection circuit of FIG. 3.

Referring also to FIG. 4, a graphical diagram is indicated generally by the reference numeral 400, showing signal waveforms of the voltage detection signals outputted from the voltage detection circuit 300 of FIG. 3. The voltage detection circuit 110 of FIG. 3 is divided into a first detection circuit 301 for generating a primary voltage detection signal POR1_1 and a second detection circuit 401 for generating a secondary voltage detection signal POR2_1. When the power source voltage supplied form the power source VDD1 goes beyond the predetermined primary detection voltage, the first detection circuit 301 detects the power source voltage and generates the primary voltage detection signal POR1_1 having an updated logic state (e.g., from a logic low state to a logic high state). In the same manner, when the power source voltage supplied form the power source VDD1 goes beyond the predetermined secondary detection voltage, the second detection circuit 401 detects the power source voltage and generates the secondary voltage detection signal POR2_1 having an updated logic state (e.g., from a logic low state to a logic high state). The first detection circuit 301 and the second detection circuit 401 have configurations similar to each other. A difference is that the MOS transistors constituting the respective circuits have different sizes and resistances. In other words, the first and second detection voltages may be determined by adjusting the sizes and resistances of the MOS transistors constituting the respective circuits.

After the power is on and a voltage of the power source VDD1 rises, if the voltage of the power source VDD1 goes beyond a primary detection voltage, the first detection circuit 301 detects the corresponding voltage and generates the primary voltage detection signal POR1_1. Then, if the voltage of the power source VDD1 continues to increase and goes beyond the secondary detection voltage, the second detection circuit 401 detects the corresponding voltage and generates the secondary voltage detection signal POR2_1.

The voltage detection circuit 110 of FIG. 3 includes voltage division units 300 and 400 for dividing the voltage supplied from the power source VDD1 when current paths are formed, and first and second detection circuits 301 and 401 for receiving two voltages divided by the voltage division units 300 and 400. The voltage division unit 300 includes two resistors, R1 and R2, connected in series between the power source VDD1 and a second node N2. If a transistor MN2 of the first detection circuit 301 is turned on, the voltage of the power source VDD1 is dropped by the two resistors R1 and R2 so that a first voltage V1 and a second voltage V2 are applied at the first node N1 disposed between the resistors R1 and R2, and the second node N2 disposed between the resistor R2 and the NMOS transistor MN1, respectively. The first detection circuit 301 includes one PMOS transistor MP1, two NMOS transistors MN1 and MN2, and three CMOS inverters INV1, INV2 and INV3 connected in series. The two NMOS transistors MN1 and MN2 are connected in series between the second node N2 and a ground terminal VSS. Here, a gate of the NMOS transistor MN1 is connected to the first node N1 and receives the first voltage V1, and a gate of the NMOS transistor MN2 is connected to the power source VDD1. A source of the NMOS transistor MN1 is connected to the second node N2 and receives the second voltage V2. A source of the NMOS transistor MN2 is connected to the ground terminal. Drains of the two NMOS transistors MN1 and MN2 are connected to each other to form a third node N3. The PMOS transistor MP1 has a source connected to the node N1 for receiving the first voltage V1, a gate connected to the second node N2 for receiving the second voltage V2, and a drain connected to the third node N3. Three inverters INV1, INV2 and INV3 are sequentially connected in series to a fourth node N4 that is connected to the gate of the PMOS transistor MP1. The primary voltage detection signal POR1_1 is outputted via a fifth node N5 connected to an output of the last inverter INV3 among the serially connected inverters INV1, INV2 and INV3.

Since the second detection circuit 401 has the same configuration as the first detection circuit 301, a detailed description for the second detection circuit 401 will be omitted. Hereinafter, an operation of the first detection circuit 301 configured as above will be described in detail.

Since the power source VDD1 is not high in an earlier state after the power is on, the NMOS transistor MN2 is not turned on so that a current path is not formed via the resistors R1 and R2. Accordingly, the voltage of the power source VDD1 is applied on the two nodes N1 and N2 so that the fourth node N4 is set to a logic high state. As a result, the primary voltage detection signal POR1_1 of the ground voltage is generated at the output node N5 of the first detection circuit 301 via the three inverters INV1, INV2 and INV3 connected in series to the fourth node N4, and then inputted into the first pulse generation circuit 140. In the same manner, since the NMOS transistor MN2' is also not turned on, the second detection circuit 401 generates the secondary voltage detection signal POR2_1 of the ground voltage at an output node N5' and then the secondary voltage detection signal POR2_1 is inputted into the second pulse generation circuit 150.

Referring again to the graphical diagram 400 of FIG. 4, if the voltage of the power source VDD1 continuously rises to turn on the NMOS transistor MN2 of the first detection circuit 301, the current path is formed via the resistors R1 and R2. Therefore, at a time t1 when the power source VDD1 reaches the first detection voltage (i.e., a time when the power source VDD1 becomes a normal state), the voltage of the fourth node N4 becomes near the ground voltage and a pull-up PMOS transistor (not shown) of the inverter INV3 is turned on. As a result, the primary voltage detection signal POR1_1 following the power source VDD1 is generated. In other words, at a time when the power source VDD1 reaches the primary detection voltage, a signal changing from a logic low state to a logic high state is generated. At this time, in the second detection circuit 401, since resistances and sizes of the transistors are set so that the time when the above procedures are performed can be t3 later than t1, the secondary voltage detection signal POR2_1 is still the ground voltage. At the time t3 when the voltage of the power source VDD1 continuously rises and reaches the secondary detection voltage, the voltage of a fourth node N4' of the second detection circuit 401 becomes near the ground voltage so that a signal following the power source VDD1 is generated at an output node N5' of the inverter INV3'.

In the same manner, the voltage detection circuit 120 connected to the power source VDD2 also generates the primary and secondary detection signals POR1_2 and POR2_2, each having logic states change in response to the voltage of the power source VDD2. In addition, the voltage detection circuit 130 connected to the power source VDD3 generates the primary and secondary detection signals POR1_3 and POR2_3, each having logic states change in response to the voltage of the power source VDD3.

The present voltage detection circuits are illustrated and described for exemplary purposes. Other voltage detection circuits can be used to generate detection signals (e.g., a signal whose logic state changes from one state to another state) when a power source voltage reaches a specific voltage. Accordingly, those skilled in the art can use various voltage detection circuits without departing from the scope of the present disclosure.

A method for generating a plurality of power-on reset pulses using a pulse generation circuit and a pulse generation method will be described. Outputs of the pulse generation circuits are pulses that are input into pulse generation units so that a plurality of power-on reset pulses are generated.

Figure 5:
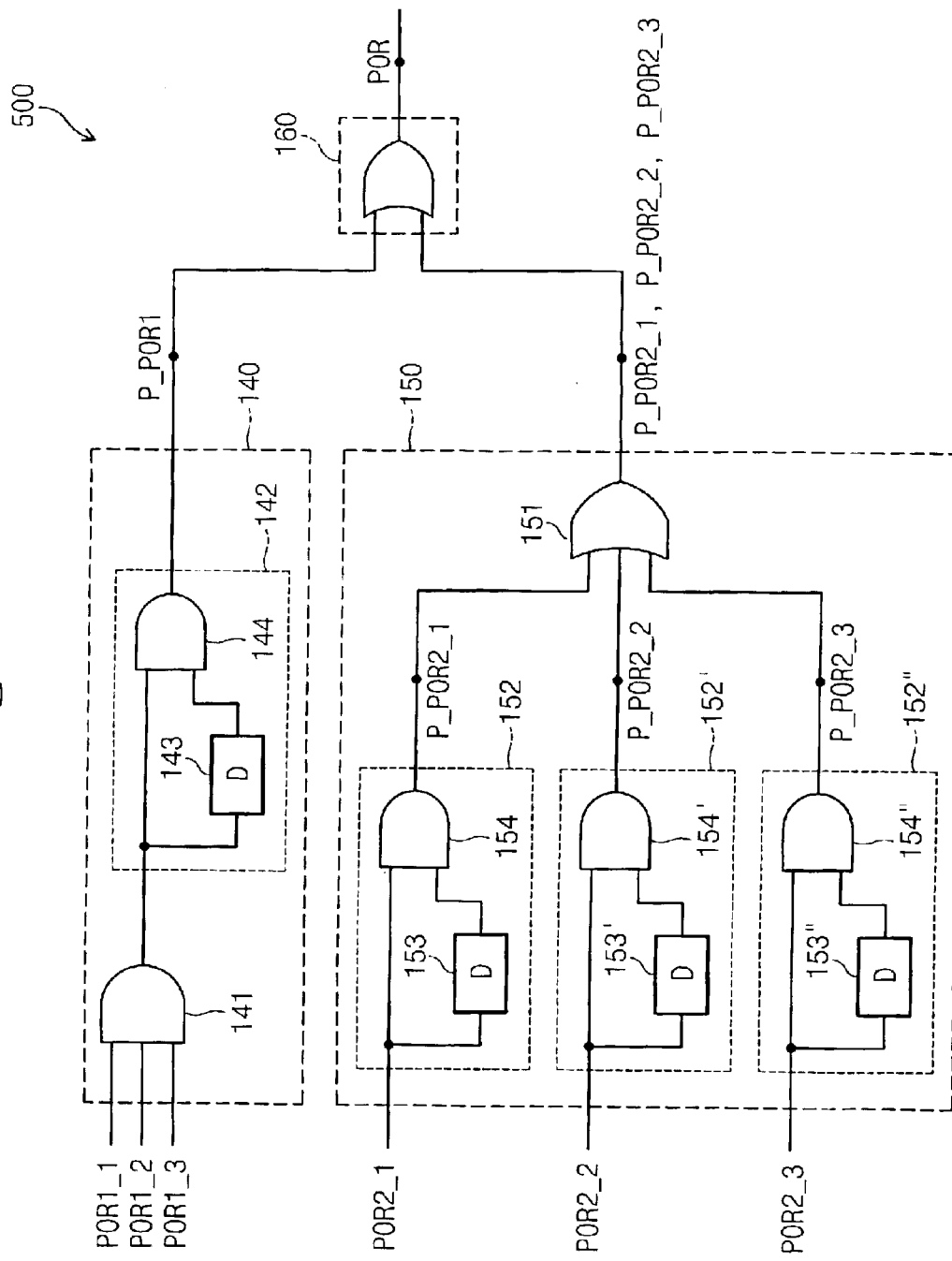
FIG. 5 is a block diagram explaining the pulse generation circuit of FIG. 2 and a method of generating the power-on reset pulses using the pulse generation circuit in accordance with an embodiment of the present invention.

As shown in FIG. 5, a block diagram circuit is indicated generally by the reference numeral 500. The circuit 500 includes the pulse generation circuits 140 and 150 of FIGS. 2 and 3, illustrated in further detail, and an OR gate corresponding to the pulse output unit 160. The pulse generation circuits 140 and 150 receive the detection signals from the detection circuits of FIG. 3 and output the pulses.

Figure 6:
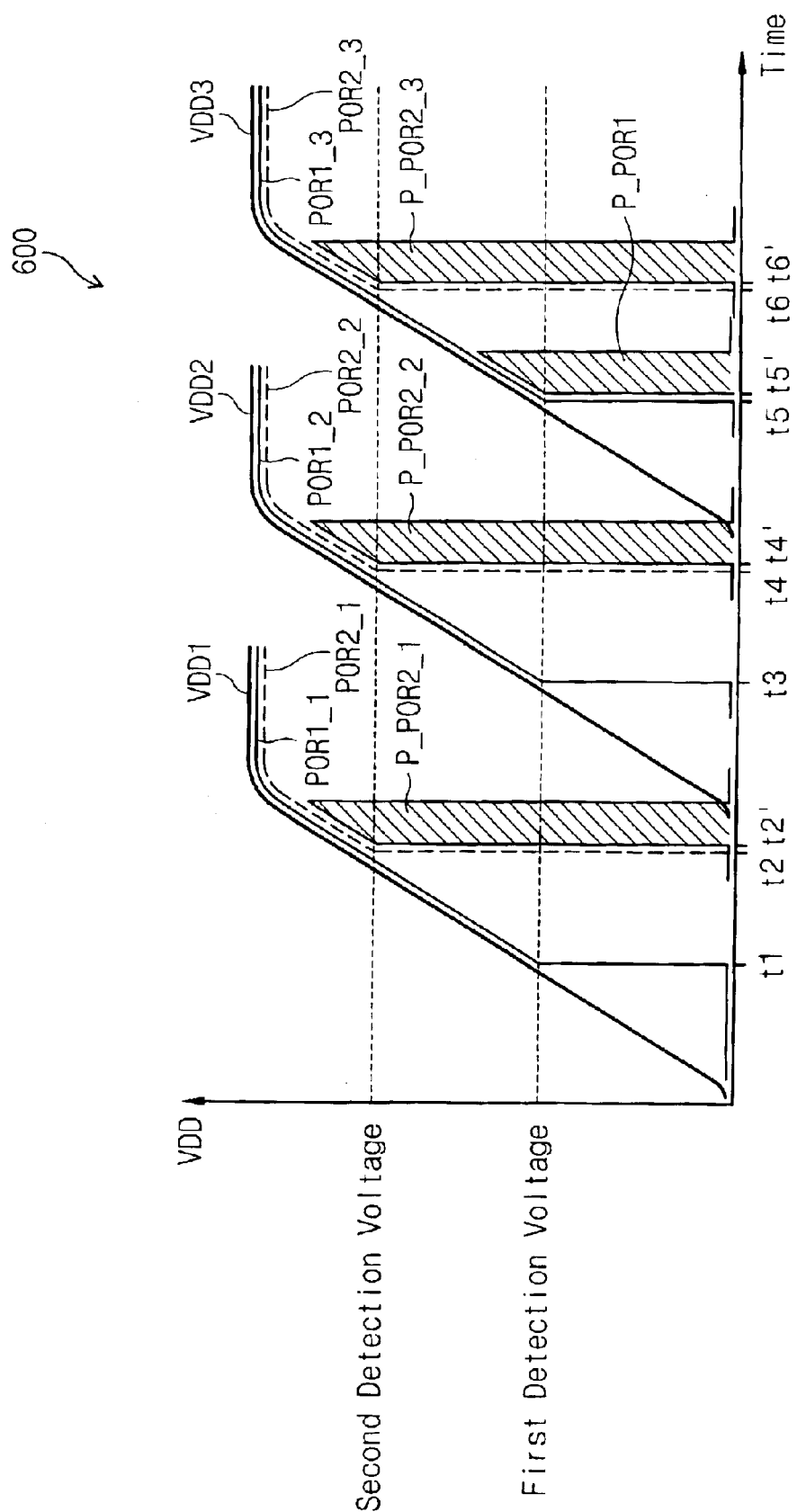
FIG. 6 is a graphical diagram of the power-on reset pulse waveform according to FIG. 5.

Turning to FIG. 6, a graphical waveform diagram of the power-on reset pulses outputted from the OR gate 160 of FIG. 5 is indicated generally by the reference numeral 600. The primary voltage detection signals POR1_1, POR1_2 and POR1_3 generated from the voltage detection circuits 110, 120 and 130 are inputted into the first pulse generation circuit 140, and the secondary voltage detection signals POR2_1, POR2_2 and POR2_3 are inputted into the second pulse generation circuit 150.

Referring again to both FIGS. 5 and 6, if the respective power sources VDD1, VDD2 and VDD3 go beyond the primary detection voltage at the respective times t1, t3 and t5, the respective first detection circuits of the voltage detection circuits generate the primary voltage detection signals POR1_1, POR1_2 and POR1_3, which follow the corresponding power sources, respectively, and then the primary voltage detection signals POR1_1, POR1_2 and POR1_3 are inputted into the first pulse generation circuit 140. In addition, if the respective power sources VDD1, VDD2 and VDD3 continuously rise and go beyond the secondary detection voltage at the respective times t2, t4 and t6, then the second detection circuits of the voltage detection circuits generate the secondary voltage detection signals POR2_1, POR2_2 and POR2_3, which follow the corresponding power sources, respectively, and then the secondary voltage detection signals POR2_1, POR2_2 and POR2_3 are inputted into the second pulse generation circuit 150.

The first pulse generation circuit 140 includes a first AND gate 141 receiving the primary detection signals POR1_1, POR1_2 and POR1_3 and a pulse generation unit 142 for generating pulses using the output of the first AND gate 141. The pulse generation unit 142 includes an inversion delay unit 143 for inverting an output of the first AND gate 141, and a second AND gate 144 for receiving the output of the inversion delay unit 143 and the output of the first AND gate 141. Accordingly, the last voltage detection pulse P_POR1 is generated at a time t5' of FIG. 6 by the detection signal POR1_3, which, in turn, was generated in response to the power source VDD3 reaching its primary detection voltage. In other words, the primary voltage detection signal POR1_3 is generated at the latest time (t5) via the output terminal of the first AND gate 141, and this signal (e.g., a signal changing from a logic low state and to a logic high state) is inputted into the second AND gate 144 so that the second AND gate 144 outputs the first pulse P_POR1 at the time t5'.

The second pulse generation circuit 150 generates the second pulses P_POR2_1, P_POR2_2 and P_POR2_3 corresponding to the secondary detection signals POR2_1, POR2_2 and POR2_3. For this, only the pulse generation unit 142 is used instead of the first AND gate 141 of the first pulse generation circuit 140. In other words, the second pulse generation circuit 150 includes a first pulse generation unit 152, a second pulse generation unit 152', a third pulse generation unit 152", which correspond to the respective secondary detection signals, and an OR gate 151 connected to output terminals of the pulse generation units. The second pulse generation units 152, 152' and 152" of the second pulse generation circuit 150 have the same configuration as the pulse generation unit 142 of the first pulse generation circuit 140. Therefore, detailed description for those operations previously described for the pulse generation unit 142 will be omitted. As shown in FIG. 6, if the power source VDD1 reaches the secondary detection voltage at the time t2, the secondary detection signal POR2_1 is generated and inputted into the first pulse generation unit 152 of the second pulse generation circuit 150. Therefore, the second pulse P_POR2_2 is generated at the time t2'. In the same manner, the secondary voltage detection signal POR2_2 generated at the time t4 is inputted into the second pulse generation unit 152' of the second pulse generation circuit 150 and the second pulse P_POR2_2 is generated at the time t4'. The secondary voltage detection signal POR2_3 generated at a time t6 is inputted into the third pulse generation unit 152" of the second pulse generation circuit 150 and the second pulse P_POR2_3 is generated at the time t6'. The generated second detection pulses P_POR2_1, P_POR2_2 and P_POR2_3 are inputted into the OR gate 151.

As a result, the pulses outputted from the pulse generation circuits 140 and 150 are inputted into the OR gate 160 acting as the pulse output unit, in which the pulses are the first voltage detection pulse P_POR1 having the height corresponding to the magnitude of the primary detection voltage and the second voltage detection pulses P_POR2_1, P_POR2_2 and P_POR2_3 having heights corresponding to the magnitude of the secondary detection voltage. Consequently, four power-on reset pulses POR are generated at the times t2', t4', t5' and t6', respectively. Accordingly, when a given power source is unstable and does not generate a corresponding power-on reset pulse, the power-on reset pulse is generated by other power sources so that a stable initialization is achieved.

The OR gate 151 of the second pulse generation circuit 150 need not be used. In other words, the pulses outputted from the pulse generation units 152, 152' and 152" of the second pulse generation circuit 150 can be directly inputted into an OR gate 160.

In addition, in the pulse generation circuit of FIG. 5, the respective pulse generation circuits can have the same configuration as other pulse generation circuits. For example, if the second pulse generation circuit 150 of FIG. 5 has the same configuration as the first pulse generation circuit 140, two power-on reset pulses P_POR1 and P_POR2 are generated from the OR gate acting as the pulse output unit. In other words, the respective pulse generation circuits generate one pulse. Meanwhile, if the first pulse generation circuit 140 of FIG. 4 has the same configuration as the second pulse generation circuit 150 of FIG. 5, six power-on reset pulses are generated from the OR gate acting as the pulse output unit. In other words, the respective pulse generation circuits generate three pulses.

Figure 7:
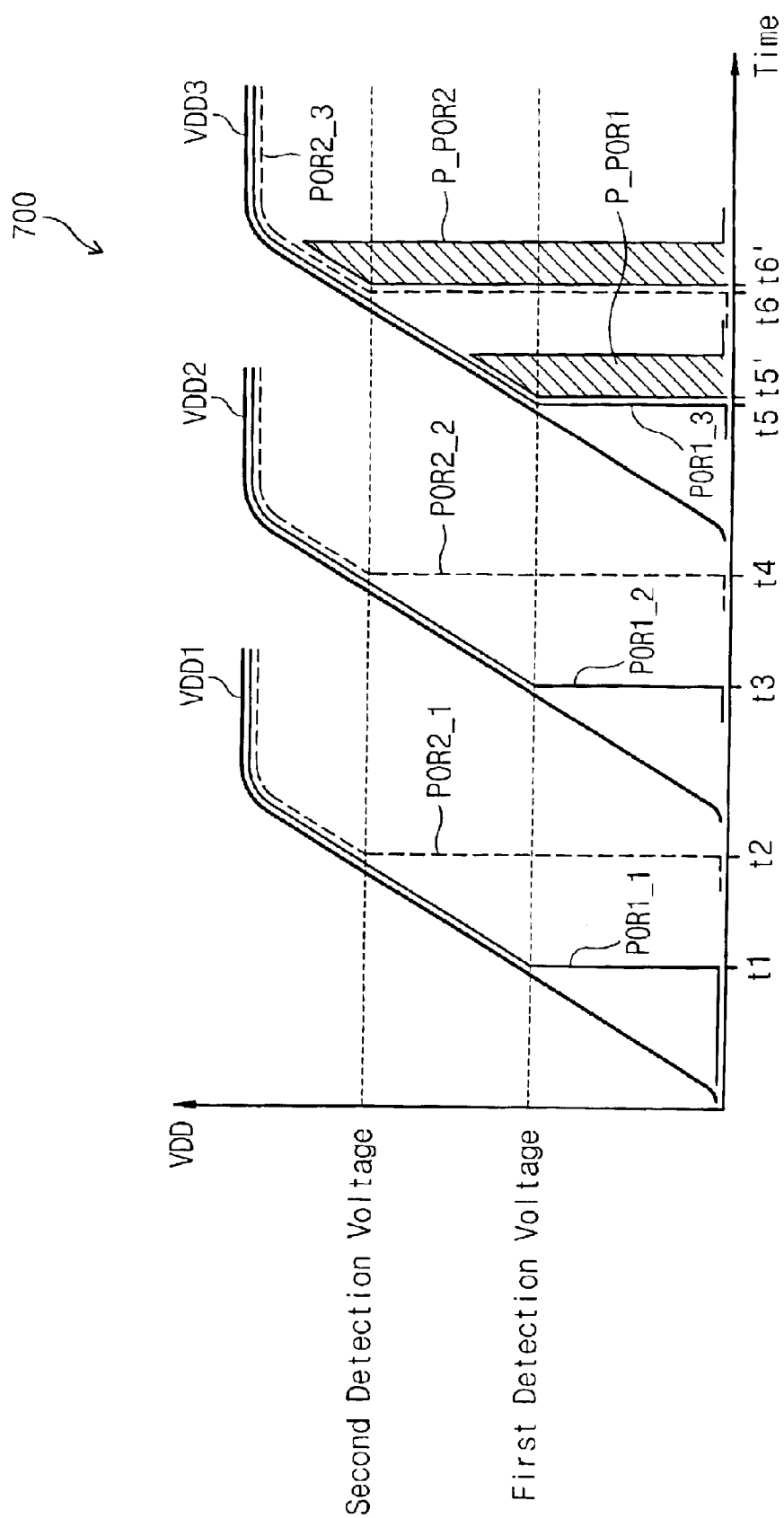
FIG. 7 is a graphical diagram of a power-on reset pulse waveform in accordance with another embodiment of the present invention.

Turning now to FIG. 7, a graphical waveform diagram of power-on reset pulses outputted from an alternate embodiment power-on reset circuit and method in accordance with the present invention is indicated generally by the reference numeral 700. In this embodiment, the first pulse generation circuit is the same as that shown as 140 in FIG. 5, but the second pulse generation circuit is also like that shown as 140 in FIG. 5, rather than that shown as 150 in FIG. 5. For this embodiment, the second pulse generation circuit is indicated generally by the reference numeral 140', and has a structure comparable to that defined by the circuit 140 of FIG. 5.

Since the second pulse generation circuit has the same configuration as the first pulse generation circuit in this alternate embodiment, two power-on reset pulses P_POR1 and P_POR2 are supplied to the OR gate acting as the pulse output unit. In other words, the respective pulse generation circuits each generate one pulse. Accordingly, the signal descriptions for the first pulse generation circuit 140 are as described with respect to FIG. 6, but the signal descriptions for the second pulse generation circuit are different from those described for FIG. 6, as described below.

Here, The secondary voltage detection signals POR2_1, POR2_2 and POR2_3 generated from voltage detection circuits 110, 120 and 130 are inputted into the first pulse generation circuit 140. If the respective power sources VDD1, VDD2 and VDD3 go beyond the primary detection voltage at the respective times t1, t3 and t5, the respective first detection circuits of the voltage detection circuits generate the primary voltage detection signals POR1_1, POR1_2 and POR1_3, which follow the corresponding power sources, respectively, and then the primary voltage detection signals POR1_1, POR1_2 and POR1_3 are inputted into the first pulse generation circuit 140. In addition, if the respective power sources VDD1, VDD2 and VDD3 further rise and go beyond the secondary detection voltage at the respective times t2, t4 and t6, then the second detection circuits of the voltage detection circuits generate the secondary voltage detection signals POR2_1, POR2_2 and POR2_3, which follow the corresponding power sources, respectively, and then the secondary voltage detection signals POR2_1, POR2_2 and POR2_3 are inputted into the second pulse generation circuit 140'.

The second pulse generation circuit 140' includes a first AND gate 141' receiving the primary detection signals POR2_1, POR2_2 and POR2_3 and a pulse generation unit 142' for generating pulses using the output of the first AND gate 141'. The pulse generation unit 142' includes an inversion delay unit 143' for inverting an output POR2_3 of the first AND gate 141', and a second AND gate 144' for receiving the output of the inversion delay unit 143' and the output of the first AND gate 141'. Accordingly, the last voltage detection pulse P_POR2 is generated at a time t6' of FIG. 7 by the detection signal POR2_3, which, in turn, was generated in response to the power source VDD3 reaching its secondary detection voltage. In other words, the secondary voltage detection signal POR2_3 is generated at the latest time (t6) via the output terminal of the first AND gate 141', and this signal is inputted into the second AND gate 144' so that the second AND gate 144' outputs second pulse P_POR2 at the time t6'.

Accordingly, in a power-on reset method for a semiconductor integrated circuit device using a plurality of power sources in accordance with the present invention, a stable and noise-resistant power-on reset can be provided using a plurality of power-on reset pulses.

It will be apparent to those of ordinary skill in the pertinent art that various modifications and variations may be made to embodiments of the present invention without departing from the scope or spirit thereof. Thus, it is intended that the present invention cover such modifications and variations defined within the scope of the appended claims and their equivalents.

What is claimed is:

1. A power-on reset method of an integrated circuit device, comprising the steps of:
   providing a power-on reset pulse whenever a plurality of respective power source voltages supplied from individual power sources reach a plurality of predetermined detection voltages, respectively; and
   initializing internal circuits of the integrated circuit device in response to the power-on reset pulse,
   wherein the step of providing the power-on reset pulse comprises the steps of:

receiving the power source voltages corresponding to the respective power sources;

generating a plurality of voltage detection signals corresponding to a plurality of predetermined detection voltages;

generating a plurality of power-on reset pulses corresponding to the plurality of predetermined detection voltages; and providing the power-on reset pulses as output, wherein at least one of the internal circuits is initialized whenever at least one of the plurality of power-on reset pulses is provided, and finally initialized by a last occurrence one of the plurality of power-on reset pulses.

2. The power-on reset method of claim 1, further comprising performing a logical OR operation on the power-on reset pulses prior to output.

3. The power-on reset method of claim 1, wherein logic states of the respective voltage detection signals change when the respective power source voltages reach corresponding detection voltages.

4. A power-on reset method for resetting internal circuits of an integrated circuit device using a plurality of power source voltages, the power-on reset method comprising the steps of:

generating voltage detection signals in response to the plurality of power source voltages when the power source voltages go beyond a plurality of detection voltages;

generating power-on reset pulses using the voltage detection signals; and initializing the internal circuits in response to the power-on reset pulses, wherein the internal circuits are initialized whenever the power-on reset pulses are generated, and finally initialized by a last occurrence one of the power-on reset pulses.

5. A power-on reset method for resetting internal circuits of an integrated circuit device using a plurality of power source voltages, the power-on reset method comprising the steps of:

generating voltage detection signals in response to the plurality of power source voltages when the power source voltages go beyond a plurality of detection voltages;

generating power-on reset pulses using the voltage detection signals; and initializing the internal circuits in response to the power-on reset pulses, wherein the plurality of detection voltages comprise a primary detection voltage and a secondary detection voltage, and the voltage detection signals comprise primary voltage detection signals and secondary voltage detection signals having logic states that change when the power source voltages go beyond the primary detection voltage and the secondary detection voltage, respectively.

6. The power-on reset method of claim 5, wherein the step of generating the power-on reset pulses comprises the steps of:

generating primary and secondary detection pulses from the primary and secondary voltage detection signals generated with respect to the respective power source voltages; and outputting the primary and secondary detection pulses via an OR gate.

7. A power-on reset circuit comprising:

a plurality M of voltage detection circuits for generating primary detection signals and secondary detection signals in response to M power source voltages when the power source voltages reach primary and secondary detection voltages;

first and second pulse generation circuits for receiving M primary detection signals and M secondary detection signals from the M voltage detection circuits and generating a maximum of M primary power-on reset pulses and a maximum of M secondary power-on reset pulses, respectively; and a pulse output means for receiving the primary and secondary power-on reset pulses and outputting final power-on reset pulses, the maximum number of final power-on reset pulses being 2×M.

8. The power-on reset circuit of claim 7, wherein the pulse output means comprises an OR gate.

9. The power-on reset circuit of claim 7, wherein each of the M voltage detection circuits comprises:

a first voltage detection circuit for generating the primary detection signals having logic states that change when the corresponding power source voltages go beyond the primary detection voltage; and a second voltage detection circuit for generating the secondary detection signals having logic states that change when the corresponding power source voltages go beyond the secondary detection voltage.

10. The power-on reset circuit of claim 7, wherein each of the first and second pulse generation circuits comprises:

a first AND gate for receiving the detection signals;

an inversion delay unit connected to an output terminal of the first AND gate; and a second AND gate connected to the output terminal of the first AND gate and an output terminal of the inversion delay unit.

11. The power-on reset circuit of claim 10, wherein the inversion delay unit comprises an odd number of inverters connected in series.

12. The power-on reset circuit of claim 7, wherein each of the first and second pulse generation circuits comprises:

a plurality M of pulse generators for generating pulses with respect to the M detection signals; and an OR gate connected to output terminals of the M pulse generators, each of the M pulse generators comprising:

an inversion delay unit for receiving a corresponding detection signal; and an AND gate for receiving an output of the inversion delay unit and the corresponding detection signal.

13. The power-on reset circuit of claim 7 wherein:

the first pulse generation circuit comprises:

a first AND gate for receiving the detection signals;

an inversion delay unit connected to an output terminal of the first AND gate; and a second AND gate connected to the output terminal of the first AND gate and to an output terminal of the inversion delay unit; and the second pulse generation circuit comprises:

M pulse generation circuits for generating pulses with respect to the M secondary detection signals; and an OR gate connected to output terminals of the M pulse generation circuits, each of the M pulse generation circuits including an inversion delay unit receiving the corresponding second detection signal and an AND gate receiving an output of the inversion delay unit and the corresponding detection signal.

14. The power-on reset circuit of claim 7, further comprising:

means for generating voltage detection signals in response to the plurality of power source voltages when the power source voltages go beyond a plurality of detection voltages;

means for generating power-on reset pulses using the voltage detection signals; and means for initializing the internal circuits in response to the power-on reset pulses.

15. The power-on reset circuit of claim 14, further comprising:

means for generating primary and secondary detection pulses from the primary and secondary voltage detection signals generated with respect to the respective power source voltages; and means for outputting the first and second detection pulses via an OR gate.

16. The power-on reset circuit of claim 7 wherein at least one of the first and second pulse generation circuits comprises an AND gate coupled to its input terminals.

17. The power-on reset circuit of claim 7 wherein at least one of the first and second pulse generation circuits comprises an OR gate coupled to its output terminal.

18. The power-on reset circuit of claim 7 wherein the first and second pulse generation circuits have the same configuration.

* * * * *